United States Patent [19]
Takaichi et al.

[11] Patent Number: 4,729,713
[45] Date of Patent: Mar. 8, 1988

[54] APPARATUS FOR HOLDING AN ELECTRONIC PART

[75] Inventors: Susumu Takaichi, Osaka; Kouji Fujiwara, Kouriyama; Masato Tanino; Tsutomu Inukai, both of Kofu, all of Japan

[73] Assignee: Matsushita Electric Industrial Co., Ltd., Japan

[21] Appl. No.: 867,683

[22] Filed: May 28, 1986

[30] Foreign Application Priority Data

May 30, 1985 [JP] Japan .................... 60-116916

[51] Int. Cl.⁴ .............................................. B65G 47/90
[52] U.S. Cl. ......................................... 414/626; 294/2; 294/64.1
[58] Field of Search ............... 414/626, 627, 737; 294/2, 64.1; 901/39; 29/739, 740, 743; 279/3, 119

[56] References Cited

U.S. PATENT DOCUMENTS

| | | | |
|---|---|---|---|
| 4,227,851 | 10/1980 | Beezer | 414/626 |
| 4,290,732 | 9/1981 | Taki et al. | 294/64.1 X |
| 4,515,507 | 5/1985 | Asai et al. | 294/64.1 X |
| 4,627,785 | 12/1986 | Monforte | 294/2 X |

Primary Examiner—Dave W. Arola
Attorney, Agent, or Firm—Lowe, Price, LeBlanc, Becker & Shur

[57] ABSTRACT

Disclosed is an apparatus for holding an electronic part including a rod coupled to a part-absorbing nozzle at one end thereof and coupled to a vacuum device at the other end portion thereof, the rod being axially movable. Also included is a sleeve member movable along the axis of the rod in response to the movement thereof. A pair of chucking jaws for chucking the electronic part are coupled through a transmission mechanism to the sleeve member. The transmission mechanism comprises a pair of curved levers each providing a connection between the chucking jaws and the sleeve member and a pair of guide members which are respectively engaged with the pair of chucking jaws and radially extend at right angles to the axis of the rod, and is arranged to allow the pair of chucking jaws to be moved at right angles to the axis of the rod member in opposite directions to each other in response to the movement of the sleeve member. The arrangement to move the chucking jaws at right angles with respect to the axis of the rod enables the electronic part to be accurately chucked by the chucking jaws irrespective of the variations of the size and configuration of the electronic part.

10 Claims, 18 Drawing Figures

APPARATUS FOR HOLDING AN ELECTRONIC PART

BACKGROUND OF THE INVENTION

1. Field of the Invention

The present invention relates to a holding apparatus, and in particular to an apparatus for chucking an electronic part for the purpose of mounting the same on a substrate such as a printed circuit board.

2. Description of the Prior Art

An important problem in the electronic circuit assembling art relates to the need for apparatus for chucking an electronic part which can reliably accommodate any electronic parts having different shapes and sizes and which can efficiently perform the mounting of electronic parts at high speed. While various types of holding apparatus have been developed hitherto, they could be not necessarily designed to sufficiently meet the requirements.

FIGS. 14 through 18 are illustrations of one example of conventional apparatus for holding an electronic part. Of these, FIG. 14 is a plan view showing the conventional holding apparatus and FIG. 15 is a sectional view taken along line C—C of FIG. 14. The conventional holding apparatus is arranged to chuck an electronic part 6 absorbed by an absorbing device 4. The holding apparatus comprises a pair of chucking jaws 32 and a pair of levers 5 each being connected to each of the chucking jaws 32. The levers 5 are respectively pivotably supported by a pair of pins 2 at one end portions thereof which are opposite to the end portions where the chucking jaws 32 are connected. The levers 5 are biased by a spring 1 to be closed, that is, to grip the electronic part 6 and are opened or closed in response to the vertical movement of a roller 3 which is coupled to the aborbing device 4.

Although satisfactory when chucking a small-size electronic part 6 as shown in FIG. 16, such an arrangement provides difficulty due to the variations of chucking position caused by the swinging movement of the levers 5 when gripping a large-size electronic part 7 and an electronic part 8 having a specific configuration as shown in FIGS. 17 and 18. Therefore, for accurately chucking these electronic parts, it will be required to exchange the chucking jaws 32 to the size and configuration of the electronic part to be held thereby.

SUMMARY OF THE INVENTION

It is therefore an object of the present invention is to provide a new and improved apparatus for holding an electronic part which overcomes the above-described disadvantages inherent in the prior art holding apparatus.

More specifically, the present invention provides an electronic part holding apparatus which is capable of accurately chucking electronic parts without making an exchange of electronic part chucking jaws irrespective of the variations in size and configuration thereof.

With this and other ojects which will become apparent as the description proceeds, an apparatus for holding a part comprises: a body; a rod member coupled to a part-absorbing nozzle at one end thereof and coupled to a vacuum device at the other end thereof, the rod member being axially movable with respect to the body; a sleeve member movable along the axis of the rod member, the sleeve member being moved in response to the movement of the rod member; a pair of chucking jaws for chucking the part after the part is absorbed by the absorbing nozzle; and a transmission mechanism including a pair of curved levers and a guide member for radially moving the pair of chucking jaws at substantial right angles with respect to the axis of the rod member in opposite directions to each other in response to the movement of the sleeve member so that the part is chucked thereby and released therefrom, each of the pair of curved levers providing a connection between each of the pair of chucking jaws and the sleeve member and the guide member having a pair of grooves radially extending at right angles to the axis of the rod member each being engaged with each of the pair of chucking jaws.

According to a feature of the present invention, the pair of chucking jaws can be moved at right angles to the axis of the rod in opposite directions to each other by means of the transmission mechanism when the rod member is actuated for the purpose of holding an electronic part. This results in enabling the electronic part to be accurately chucked by the chucking jaws irrespective of the variations of the size and configuration of the electronic part.

BRIEF DESCRIPTION OF THE DRAWINGS

The object and features of the present invention will become more readily apparent from the following detailed description of the preferred embodiments taken in conjunction with the accompanying drawings in which.

DETAILED DESCRIPTION OF THE INVENTION

Figure 1:
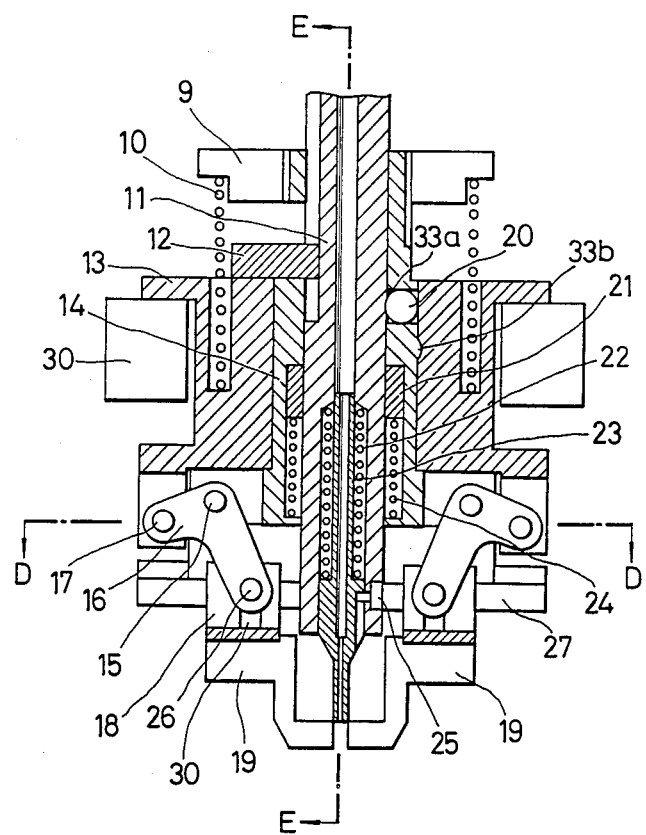
FIG. 1 is a cross-sectional view illustrating an apparatus for holding an electronic part according to an embodiment of the present invention.
Figure 2:
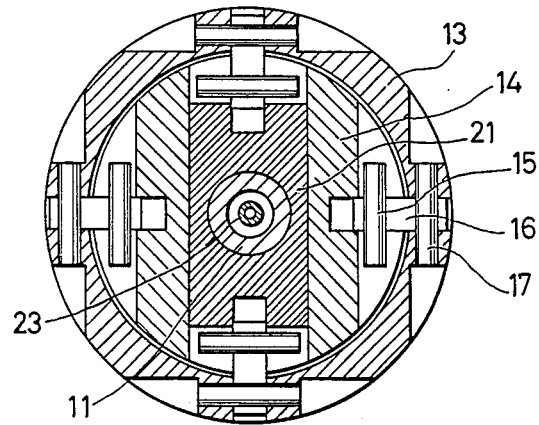
FIG. 2 is a cross-sectional view taken along line D—D of FIG. 1.
Figure 3:
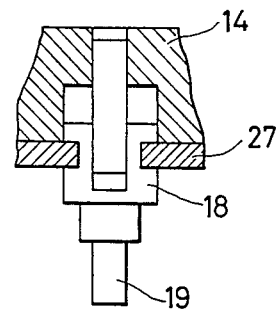
FIG. 3 is a partially sectional view of the apparatus of FIG. 1.
Figure 4:
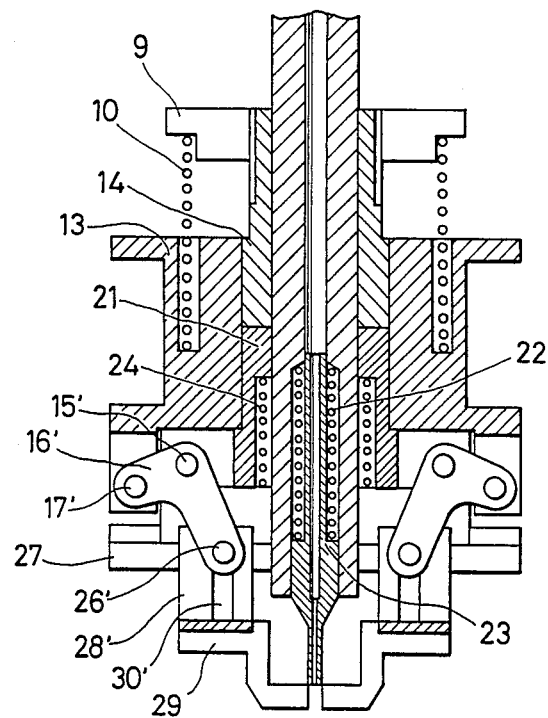
FIG. 4 is a cross-sectional view taken along line E—E of FIG. 1.
Figure 5:
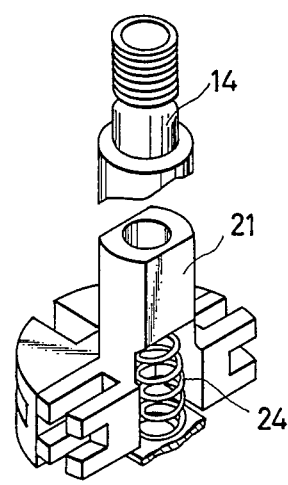
FIGS. 5, 6 and 7 are perspective views illustrating sleeves employed for the apparatus according to the embodiment of this invention.
Figure 6:
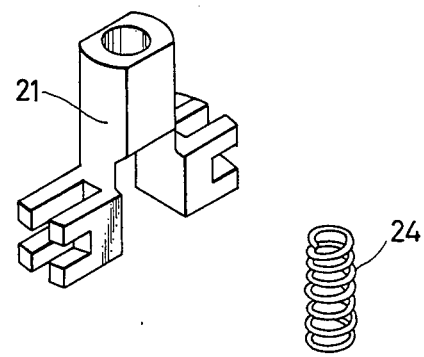
Figure 7:
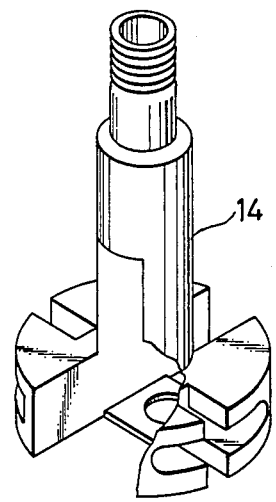
Figure 8:
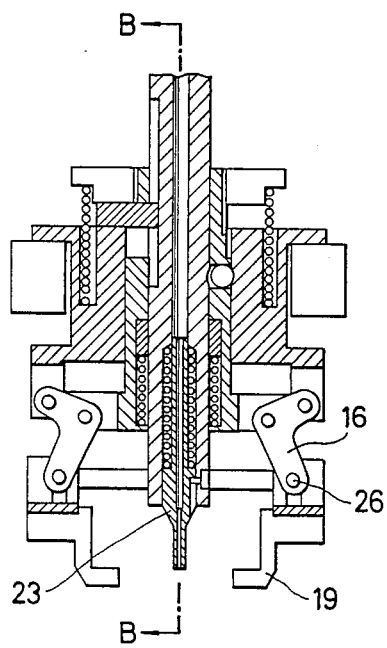
FIGS. 8, 9, 10 and 11 are illustrations for describing the motion of the apparatus according to the embodiment of this invention.

Referring now to FIGS. 1 through 4, there is illustrated an apparatus for holding an electronic part according to an embodiment of the present invention. The apparatus includes a rod 11 axially movable with respect to a body 13 of the holding apparatus which is supported by a cam follower 30. The rod 11 has a part-absorbing nozzle 23 at an end thereof and is coupled to a vacuum absorbing device, not shown, at the other end. The opening of the nozzle 23 is coupled through a vacuum passage defined in the rod 11 to the vacuum absorbing device. The absorbing nozzle 23 is biased downwardly by means of a spring 22 disposed in the rod 11 and is locked by a pin 25 mounted on the rod 11 to counter the biasing force of the spring 22. Therefore, the downward movement of the nozzle 23 is limited thereby, while the upward movement thereof is allowed against the biasing force of the spring 22. Also included in the apparatus are first and second sleeves 14 and 21 which are respectively movable along the axis of the rod 11. The structures thereof will be clearly seen by referring to FIGS. 5 through 7. A pair of first curved levers 16 are pivotally supported at one ends thereof by pins 17 which are respectively secured to the body 13 of the holding apparatus. A pair of second curved levers 16' are pivotally supported at one ends thereof by pins 17' which are respectively secured to the body 13. The first and second curved levers 16 and 16' are respectively connected to the first and second sleeves 14 and 21 at the intermediate portions thereof by means of pins 15 and 15' so as to be respectively swung inwardly outwardly about the pins 17 and 17' in response to the movements of the first and second sleeves 14 and 21.

Each of the pair of first curved levers 16 has a pin 26 at the other end thereof, the pin 26 being inserted into an elongated hole 30 formed substantially parallel to the axis of the rod 11 in each of a pair of block members 18. The pair of block members 28 are respectively engaged with a pair of first grooves (FIG. 3) of a guide member 27 which are radially formed at substantially right angles to the axis of the rod 11 in opposed relation to each other so that they are respectively slidably movable along the pair of first grooves. The guide member 27 is a circular plate and is secured to the first sleeve 14 to be moved therewith. Therefore, with this arrangement, the pair of the block members 18 can be moved at substantially right angles to the axis of the rod 11 in opposite directions to each other with the curved levers 16 pivoting in response to the movement of the first sleeve 14. A pair of chucking jaws 19 for chucking an electronic part are respectively mounted on the lower surfaces of the block members 18 to be moved inwardly and outwardly at right angles to the axis of the rod 11 in opposite directions to each other.

Similarly, each of the second pair of curved levers 16' has a pin 26' at the other end thereof, the pin 26' being inserted into an elongate hole 30' formed in parallel to the axis of the rod 11 in each of a pair of block members 28'. The pair of block members 28' are respectively engaged with a pair of second grooves (not shown) of the guide member 27 which are radially formed at substantially right angles to the axis of the rod 11 and to the longitudinal axes of the pair of first grooves so that they are respectively slidably movable along the second grooves of the guide member 27. The pair of the block members 28' can be moved at right angles to the axis of the rod 11 in opposite directions each other with the pair of curved levers 16' pivoting inwardly outwardly in response to the movement of the second sleeve 21 along the axis of the rod 11. A pair of chucking jaws 29 for chucking the electronic part are respectively mounted on the lower surfaces of the block members 28' to be moved therewith.

Although in this embodiment illustrated the holding apparatus has two pair of chucking jaws for the purpose of chucking the four portions of an electronic part, it is appropriate to use one pair of chucking jaws. In this case, the one pair of chucking jaws will be associated with the second sleeve.

The rod 11 is operatively associated with the first sleeve 14 through a steel ball 20. The steel ball 20 is placed in a hole formed in the first sleeve 14 and also inserted into a recess 33a made in the rod 11. Therefore, when the rod 11 is moved downwardly by means of a rod driving device (not shown) for the purpose of holding an electronic part, the first sleeve 14 is moved with the rod 11 against the biasing force of a spring 10 provided between the body 13 and a nut member 9 secured to the upper portion of the first sleeve 14. In response to the downward movement of the rod 11 and the first sleeve 14, the second sleeve 21 is pushed downwardly by the first sleeve 14 and is also moved therewith against the biasing force of a spring 24 provided to bias the second sleeve 21 upwardly, while the chucking jaws 19 and 29 are respectively started to be moved radially outwardly along the first and second grooves. When the first sleeve 14 is moved downwardly by a predetermined distance, the nut member 9 comes into contact with a stopper 12 mounted on the body 13 so that the movement of the first sleeve 14 is limited. The distance determines the opening degree of the chucking jaws 19. Another recess 33b is formed in the body 13 to the position of the steel ball 20 when the movement of the first sleeve 14 is stopped so that the steel ball 20 can be released from the recess 33a of the rod 11 and accepted in the recess 33b of the body 13. Therefore, rod 11 can further be moved downwardly in order to absorb an electronic part with the chucking jaws 19 and 29 being respectively opened.

Figure 9:
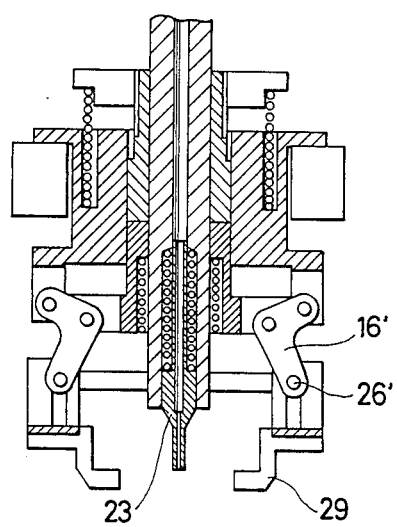
Figure 10:
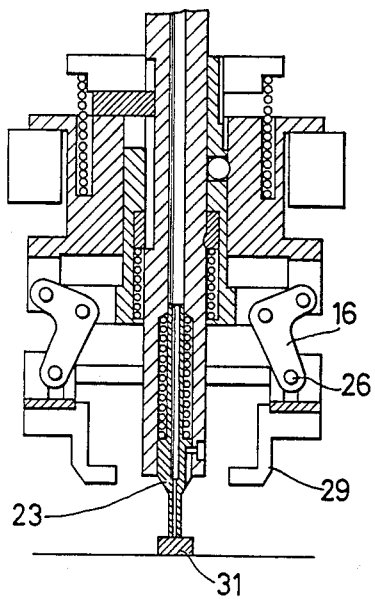
Figure 11:
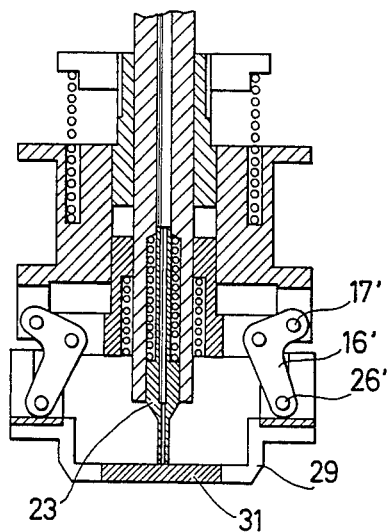
Figure 12:
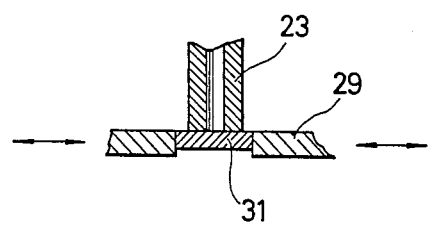
FIGS. 12 and 13 are illustrations for describing the movement of the chucking jaws with respect to an electronic part.
Figure 13:
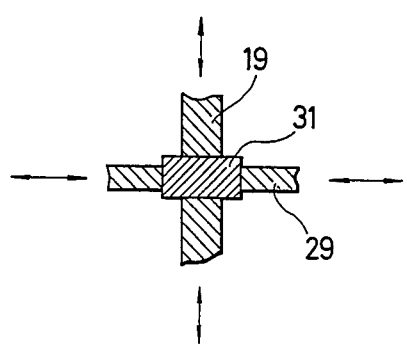
Figure 14:
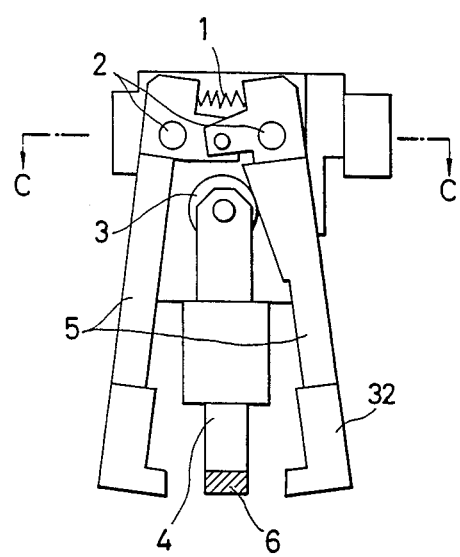
FIG. 14 is a plan view showing a conventional apparatus for holding an electronic part.
Figure 15:
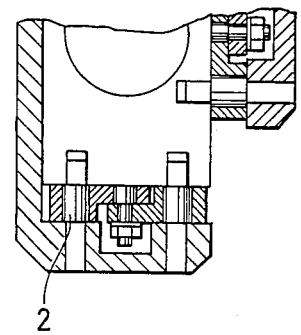
FIG. 15 is a cross-sectional view taken along line C—C of FIG. 14.
Figure 16:
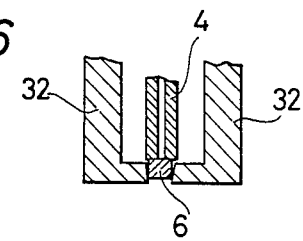
FIGS. 16, 17 and 18 are diagrams showing electronic parts chucked by the conventional apparatus of FIG. 14.
Figure 17:
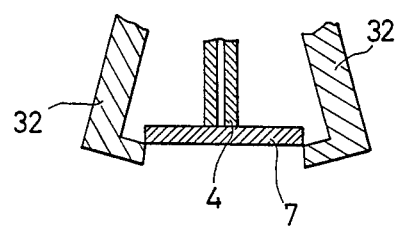
Figure 18:
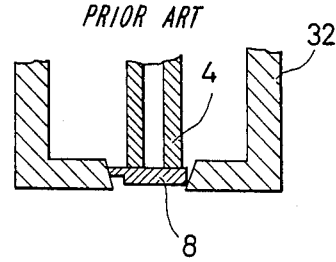

The above description will be understood by referring to FIGS. 8 through 11 showing the conditions that the chucking jaws 19 and 29 are respectively opened and an elctronic part 31 is chucked thereby. Of these figures, FIGS. 9 and 11 are illustrations useful for understanding the operation of the chucking jaws 29 which are set to chuck the both end surfaces of the part 31 perpendicular to the longitudinal direction thereof. After the electronic part 31 is absorbed by the absorbing nozzle 23, the rod 11 is first lifted up to the position at which the recess 33a thereof faces the steel ball 20 by means of the rod drive device and then further lifted with the first sleeve 14 by the aid of the biasing force of the spring 10. In response to the first sleeve 14 being lifted, the second sleeve 21 is also lifted by the biasing force of the spring 24 and the chucking jaws 19 and 29 are respectively started to be moved inwardly to chuck the absorbed electronic part 31. In this case, the lifting of the second sleeve 21 is stopped when the longitudinal ends of the part 31 are chucked by the chucking jaws 29, while the first sleeve 14 is further lifted until the other ends thereof are chucked by the chucking jaws 19. Namely, the movement of the first sleeve 14 is separated from the movement of the second sleeve 21. The chucking of the part 31 is achieved with forces corresponding to the biasing forces of the spring 10 and the spring 24. FIGS. 12 and 13 are illustrations useful for understanding the movements of the chucking jaws 19 and 29 in relation to the electronic part 31.

It should be understood that the foregoing relates to only preferred embodiment of the invention, and that it is intended to cover all changes and modifications of the embodiment of the invention herein used for the purposes of the disclosure, which do not constitute departures from the spirit and scope of the invention.

What is claimed is:

1. An apparatus for holding a part, comprising:
a hollow cylindrical body;

a rod member inserted into said body so as to be movable in the directions of the axis of said body, said rod member having a part-absorbing nozzle at the lower end portion thereof;

sleeve means inserted into said body in coaxial relation to said rod member and between said body and said rod member so as to be movable in the directions of the axis of said body, said sleeve means being operatively coupled to said rod member so as to be movable together therewith;

a pair of chucking jaws for chucking the part, said chucking jaws being placed in the vicinity of said part-absorbing nozzle; and transmission means arranged to allow said pair of chucking jaws to be radially movable at substantial right angles to the axis of said rod member in opposite directions to each other in response to the movement of said sleeve means, said transmission means including a pair of curved levers each being provided for a connection between each of said pair or chucking jaws and sleeve means and further including guide means which radially extends at substantially right angles to the axis of said rod member and which is secured to said sleeve means so that it is movable in the directions of the axis of said rod member in response to the movement of said sleeve means, each of said pair of curved levers being swingable with respect to said body in response to the movement of said sleeve means and being loosely connected to each of said pair of chucking jaws so that the swinging movement thereof is transmitted to each of said pair of chucking jaws, each of said chucking jaws being engaged with said guide means so that it is movable along said guide means and in the directions substantially normal to the axis of said rod member in response to the swinging movement of each of said pair of curved levers and the movement of said sleeve means in the directions of the axis of said rod member.

2. An apparatus as claimed in claim 1, wherein one end portion of each of said pair of curved levers is pivotally supported by said body, an intermediate portion of which is pivotally connected to said sleeve means, and the other end portion of which has a pin engaged with an elongated hole formed in parallel to the axis of said rod member in each of said pair of chucking jaws.

3. An apparatus as claimed in claim 1, further comprising spring means for upwardly biasing said sleeve means, the part being chucked by said pair of chucking jaws with a force corresponding to the biasing force of said spring means.

4. An apparatus for holding a part, comprising:
a hollow cylindrical body;
a rod member inserted into said body so as to be movable in the directions of the axis of said body, said rod member having a part-absorbing nozzle at the lower end portion thereof;
first sleeve means inserted into said body in coaxial relation to said rod member and between said body and said rod member so as to be movable in the directions of the axis of said body, said first sleeve means being operatively coupled to said rod member so as to be movable together therewith;
second sleeve means inserted into said body in coaxial relation to said rod member and between said body and said rod member, said second sleeve means being positioned below said first sleeve means so that it is movable with the downward movement of said first sleeve means;

a pair of chucking jaws for chucking the part, said chucking jaws being placed in the vicinity of said part-absorbing nozzle; and transmission means arranged to allow said pair of chucking jaws to be radially movable at substantial right angles to the axis of said rod member in opposite directions to each other in response to the movement of said second sleeve means, said transmission means including a pair of curved levers each being provided for a connection between each of said pair of chucking jaws and said second sleeve means and further including guide means which radially extends at substantially right angles to the axis of said rod member and which is secured to said first sleeve means so that it is movable in the directions of the axis of said rod member in response to the movement of said sleeve means, each of said pair of curved levers being swingable with respect to said body in response to the movement of said second sleeve means and being loosely connected to each of said pair of chucking jaws so that the swinging movement thereof is transmitted to each of said pair of chucking jaws, each of said chucking jaws being engaged with said guide means so that it is movable along said guide means and in the directions substantially normal to the axis of said rod member in response to the swinging movement of each of said pair of curved levers and the movement of said second sleeve means in the directions of the axis of said rod member.

5. An apparatus as claimed in claim 4, wherein one end portion of each of said pair of curved levers is pivotally supported by said body, an intermediate portion of which is pivotally connected to said second sleeve means, and the other end portion of which has a pin engaged with an elongated hole formed in parallel to the axis of said rod member in each of said pair of chucking jaws.

6. An apparatus as claimed in claim 4, further comprising first spring means for upwardly biasing said first sleeve means and second spring means for upwardly biasing said second sleeve means, the part being chucked by said pair of chucking jaws with a force corresponding to the biasing force of said second spring means.

7. An apparatus for holding a part, comprising;
a hollow cylindrical body;
a rod member inserted into said body so as to be movable in the directions of the axis of said body, said rod member having a part-absorbing nozzle at the lower end portion thereof;
first sleeve means inserted into said body in coaxial relation to said rod member and between said body and said rod member so as to be movable in the directions of the axis of said body, said first sleeve means being operatively coupled to said rod member so as to be movable together therewith;
second sleeve means inserted into said body in coaxial relation to said rod member and between said body and said rod member, said second sleeve means being positioned below said first sleeve means so that it is movable with the downward movement of said first sleeve means;
a pair of first chucking jaws for chucking two end surfaces of the part in opposed relation to each other, said first chucking jaws being placed in the vicinity of said part-absorbing nozzle;

a pair of second chucking jaws for chucking the other end surfaces thereof, said second chucking jaws being placed in the vicinity of said part-absorbing nozzle and being in orthogonal relation to said first chucking jaws;

first transmission means arranged to allow said pair of first chucking jaws to be radially movable at substantial right angles to the axis of said rod member in opposite directions to each other in response to the movement of said first sleeve means, said first transmission means including a pair of first curved levers each being provided for a connection between each of said pair of first chucking jaws and said first sleeve means and further including first guide means which radially extends at substantially right angles to the axis of said rod member and which is secured to said first sleeve means so that it is movable in the directions of the axis of said rod member in response to the movement of said first sleeve means, each of said pair of first curved levers being swingable with respect to said body in response to the movement of said first sleeve means and being losely connected to each of said pair of first chucking jaws so that the swinging movement thereof is transmitted to each of said pair of first chucking jaws, each of said first chucking jaws being engaged with said first guide means so that it is movable along said first guide means and in the directions substantially normal to the axis of said rod member in response to the swinging movement of each of said pair of curved levers and the movement of said second sleeve means in the directions of the axis of said rod member; and second transmission means arranged to allow said pair of second chucking jaws to be radially movable at substantial right angles to the axis of said rod member and to the directions of the movements of said pair of first chucking jaws in opposite directions to each other in response to the movement of said second sleeve means, said second transmission means including a pair of second curved levers each being provided for a connection between each of said pair of second chucking jaws and said second sleeve means and further including second guide means which radially extends at substantially right angles to the axis of said rod member and in directions normal to the extending directions of said first guide means and which is secured to said first sleeve means so that it is movable in the directions of the axis of said rod member in response to the movement of said first sleeve means, each of said pair of second curved levers being swingable with respect to said body in response to the movement of said second sleeve means and being loosely connected to each of said pair of second chucking jaws so that the swinging movement thereof is transmitted to each of said pair of second chucking jaws, each of said second chucking jaws being engaged with said second guide means so that it is movable along said second guide means and in the directions substantially normal to the axis of said rod member in response to the swinging movement of each of said pair of second curved levers and the movement of said second sleeve means in the directions of the axis of said rod member.

8. An apparatus as claimed in claim 7, wherein one end portion of each of said pair of first curved levers is pivotally supported by said body, an intermediate portion of which is pivotally connected to said first sleeve means, and the other end portion of which has a pin engaged with an elongated hole formed in parallel to the axis of said rod member in each of said pair of first chucking jaws, one end portion of each of said pair of second curved levers is pivotally supported by said body, an intermediate portion of which is pivotally connected to said second sleeve means, and the other end portion of which has a pin engaged with an elongated hole formed in parallel to the axis of said rod member in each of said pair of second chucking jaws.

9. An apparatus as claimed in claim 7, further comprising first spring means for upwardly biasing said first sleeve means and second spring means for upwardly biasing said second sleeve means, the part being chucked with a force corresponding to the biasing force of said first spring means and a force corresponding to the biasing force of said second spring means.

10. An apparatus for holding a part, comprising:
a body;
a part-absorbing nozzle mounted to the body;
a rod member connected to said part-absorbing nozzle at one end thereof, said rod member being axially movable with respect to said body;
sleeve means connected to the body and movable along the axis of said rod member in response to the movement of said rod member;
a pair of chucking jaws connected to the body for chucking the part; and
transmission means connected to the chucking jaws and sleeve means and arranged for moving said pair of chucking jaws at substantially right angles to the axis of said rod member in opposite directions to each other in response to the movement of said sleeve means, said transmission means including a pair of levers each providing a connection between each of said pair of chucking jaws and the sleeve means and further including guide means connected to the sleeve means and extending radially at generally right angles to the axis of said rod member to provide guiding movement for said chucking jaws in radial directions generally perpendicular to the axis of said rod member in response to movement of said levers and sleeve means.

* * * * *